United States Patent [19]

Azuchi

[11] Patent Number: 4,657,719
[45] Date of Patent: Apr. 14, 1987

[54] METHOD OF FORMING COVER SHEET IN OPENING OF ROTARY ELECTRIC DEVICE

[75] Inventor: Yukihiro Azuchi, Sabae, Japan

[73] Assignee: Murata Manufacturing Co., Ltd., Japan

[21] Appl. No.: 678,695

[22] Filed: Dec. 6, 1984

[30] Foreign Application Priority Data

Dec. 12, 1983 [JP] Japan .................. 58-234685

[51] Int. Cl.⁴ .............................. B29C 39/10
[52] U.S. Cl. .................... 264/153; 264/161; 264/163; 264/268; 264/272.11; 264/272.18; 264/279
[58] Field of Search ........... 264/248, 272.11, 272.18, 264/279, 250, 268, 153, 161, 163

[56] References Cited

U.S. PATENT DOCUMENTS 3,346,435 10/1967 Beck ..................... 264/248
3,354,603 11/1967 Katzen et al. ........... 264/248
4,079,567 3/1978 Spruyt et al. ........... 264/248
4,421,705 12/1983 Hatakeyama et al. ...... 264/259

FOREIGN PATENT DOCUMENTS 626439 8/1961 Canada ................. 264/248
1137026 5/1957 France ................. 264/259
148115 11/1980 Japan .................. 264/250
58-72353 4/1983 Japan .

OTHER PUBLICATIONS

Translation of 55-148115 (Mitsubishi) Japan.

Primary Examiner—James Lowe
Attorney, Agent, or Firm—Ostrolenk, Faber, Gerb & Soffen

[57] ABSTRACT

A method of forming a cover sheet over an opening of a rotary electric device such as a trimmer capacitor or a variable resistor. The rotary device includes a rotor located in a housing or case which is accessible through the opening and adjustable by a screwdriver or similar tool. To form the cover sheet, pliable resin is extended while in an unhardened state to form a film. The case is pressed against the film to introduce a part of the film into the opening. Then the resin material forming the film is allowed to partially harden before the case is separated from the film. As a result, part of the film remains in the opening of the case to form the cover sheet. As the film is completely hardened a functional cover sheet over the opening is produced.

16 Claims, 17 Drawing Figures

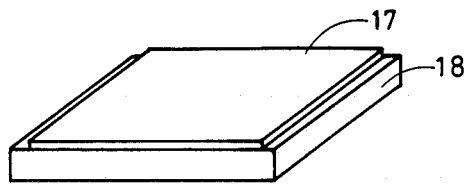
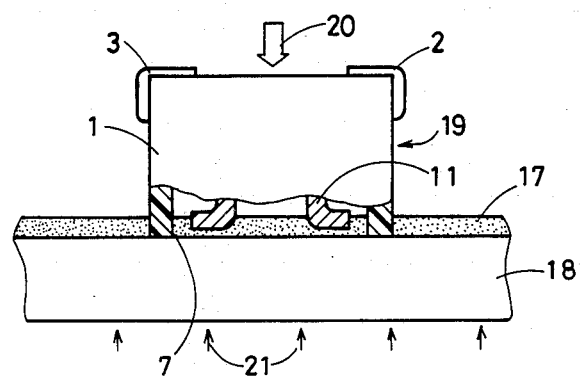
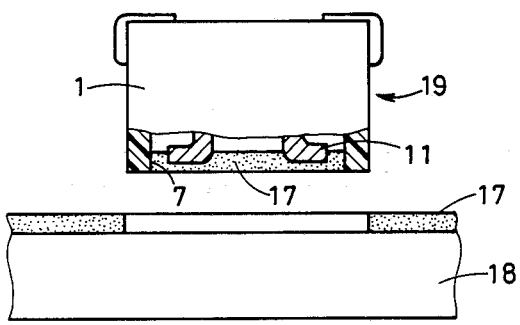
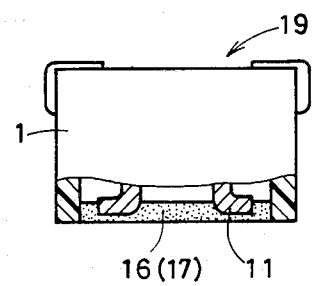
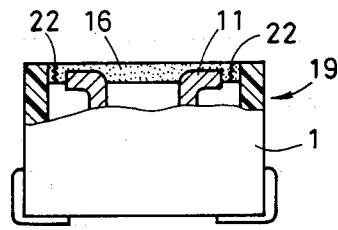

METHOD OF FORMING COVER SHEET IN OPENING OF ROTARY ELECTRIC DEVICE

BACKGROUND OF THE INVENTION

The present invention relates to a method of forming a cover sheet for closing an opening in a case of a rotary electric device which contains a rotary mechanism.

To operate the rotary mechanism, a screw driver or similar tool is inserted into the opening to rotate. However, during assembly of the electric device, the opening is protected by the cover sheet. Examples of rotary electric devices are trimmer capacitors, variable resistors, variable coils and rotary switches etc., The present invention may be applied to any type of such rotary electric devices.

A rotary electric device comprises a rotary mechanism portion including a rotor means and a stator means contained in a case. In such a rotary electric device, the rotor means is rotated to change, e.g., the capacity in a trimmer capacitor and the resistance value in a variable resistor. Therefore, the case of the rotary electric device is provided with an opening through which the rotor means is rotated for performing the desired adjustment to change the characteristics of the rotary electric device from the exterior thereof.

When a rotary electric device is mounted on a printed circuit board etc., flux used in soldering the device to the circuit board may enter the case through the opening formed therein. This has a negative influence on the characteristics of the rotary electric device. Further, to improve workability and reduce mass production cost, it is desired to pass all of electric or electronic components through a molten solder tank thereby to simultaneously solder a plurality of electric or electronic components on the printed circuit board etc. In this case, however, the solder inevitably enters the rotary electric device through the opening formed in the case to disadvantageously influence the rotor means and stator means etc., and as a result, for example, rotation of the rotor means might be prevented and characteristics of a dielectric member or resistance film serving as the stator means might be degraded. Thus, it has generally been required to separately solder a rotary electric device such as a trimmer capacitor after the dipping operation.

In this regard, there has been provided the so-called closed type rotary electric device to which a cover sheet is applied to close the opening defined in its case thereby to prevent entry of flux used in soldering and solder from a molten solder tank. Such a closed type rotary electric device is disclosed, for example, in Japanese patent laid open document No. 72353/1983 of the present invention and others, published on Apr. 30, 1983. In this prior art, a heat-resistant cover sheet of polyimide resin is applied to the outer surface of the case to close an opening defined therein by a heat-resistant adhesive. In the closed type rotary electric device, therefore, the entry of flux employed in soldering is prevented as is the entry of solder when the device is dipped in a molten solder tank, to thereby enable simultaneous soldering of the rotary electric device with other electric or electronic components.

The cover sheet is made of material having such thickness and strength that it can be easily broken by a screwdriver etc., and hence the rotor means can be readily rotated by the screwdriver etc. with the cover sheet being broken by the screwdriver when it is necessary to rotate the rotor means of the rotary electric device.

However, as taught by the prior art, it is difficult to perform the step of applying the cover sheet to the case of the rotary electric device. When a plurality of cover sheets are applied one by one to small-sized rotary electric devices, some as small as several millimeters square in dimension, the sizes of the rotary electric devices and the cover sheets are too small to process and handle.

Therefore, it is extremely difficult to apply such cover sheets to such rotary electric devices. Accordingly, it has been proposed to prepare a large-sized cover sheet and to apply it to a plurality of rotary electric devices. Then the larged-sized cover sheet member is cut leaving an individual cover for each device. However, it is difficult to sever the large cover sheet member along the outer periphery of the case or housing of each rotary electric device. Further, the thickness or the height of the rotary electric device is increased by application of the cover sheet, and such increase in size is undesirable particularly in small-sized rotary electric devices. Further, when a cover sheet of polyimide resin is broken while a rotor is rotated, the fragments of the cover sheet may enter the case.

SUMMARY OF THE INVENTION

Accordingly, it is an object of the present invention to provide an efficient method of forming a cover sheet in an opening of a rotary electric device to overcome the aforementioned disadvantages of the prior art.

The present invention is characterized in that hardenable resin which is sufficiently hard in its uncured state to maintain its shape is employed to form a film type cover sheet. Electric devices are pressed against the film and remain stationary until the film partially hardens. Then, as the devices are lifted from the film, a resin film adheres to the opening of each device.

More specifically, the method according to the present invention comprises:

forming a film of a hardenable shape-retaining resin on a base plate in an unhardened stage for forming a film, pressing the case of a rotary electric device against the film in the unhardened stage with an opening defined in the case facing the film for intruding the edge portion of the opening into the film so that the film is partially in contact with the inner peripheral surface of the opening thereby introducing into the opening resin material, separating the film in the opening from the remainder of the resin, and hardening the resin material to form the cover sheet.

According to the present invention, the resin material for forming the cover sheet comprises and is handled as a viscous material during the final steps of cover sheet forming. Such viscous material can be easily shaped into a film, which follows the form of the cover sheet to be finally formed. The case is pressed against the unhardened film which extends over a base plate whereby the resin material for forming the cover sheet is readily introduced into the opening in the case. In other words, the resin material for forming the cover sheet is in contact with the inner peripheral surface of the edge of the opening. Thereafter the resin material is hardened whereby a cover sheet is formed which closes the opening of the case and bonds to the inner peripheral surface of the opening. A cover sheet may be formed by the aforementioned steps more efficiently than with prior art techniques in which an independently prepared cover sheet is applied to the case of a rotary electric device.

Further, the cover sheet according to the present invention is directly bonded to the inner peripheral surface of the edge of the opening defined in the case and, therefore, the cover sheet does not project from the outer surface of the case. Thereby, the thickness or height of the rotary electric device does not increase. In addition, the material or the thickness etc. of the cover sheet may be so selected as not to prevent rotation of the rotor means. In other words, the cover sheet may be formed to be easily broken or stretched, or partially stretched and partially broken, when the rotor means is rotated. The thickness of the cover sheet can be readily controlled by adjusting the thickness of the film initially formed on the base plate.

The above and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 6 illustrate successive steps of an embodiment of the present invention;

FIG. 7 is an illustration showing a cover sheet 16 which is broken when a rotary electric device 19 is adjusted;

DESCRIPTION OF THE PREFERRED EMBODIMENTS

Figure 1:
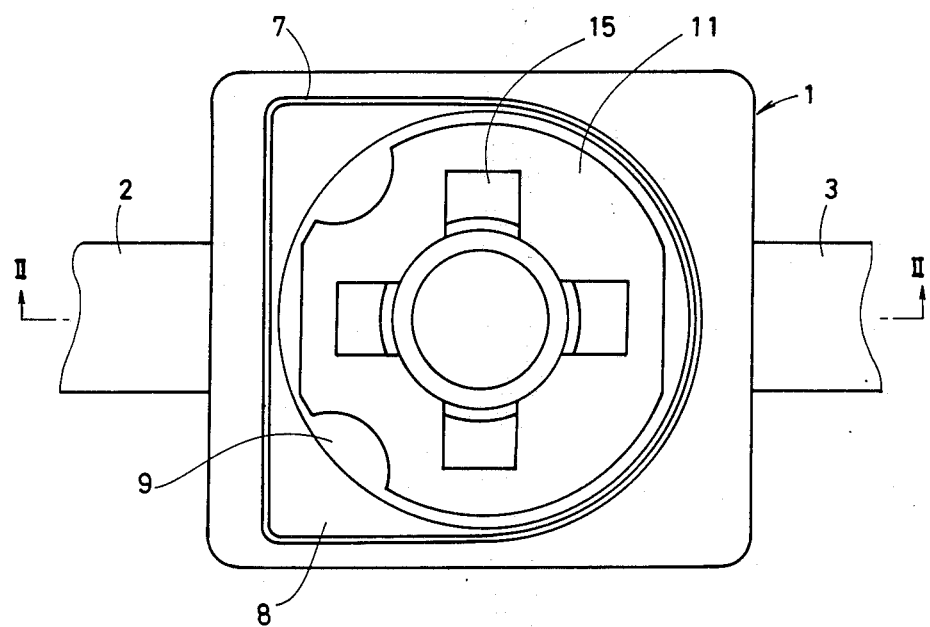
FIG. 1 is a plan view showing a trimmer capacitor used as an example of a rotary electric device to which an embodiment of the present invention is applied.
Figure 2:
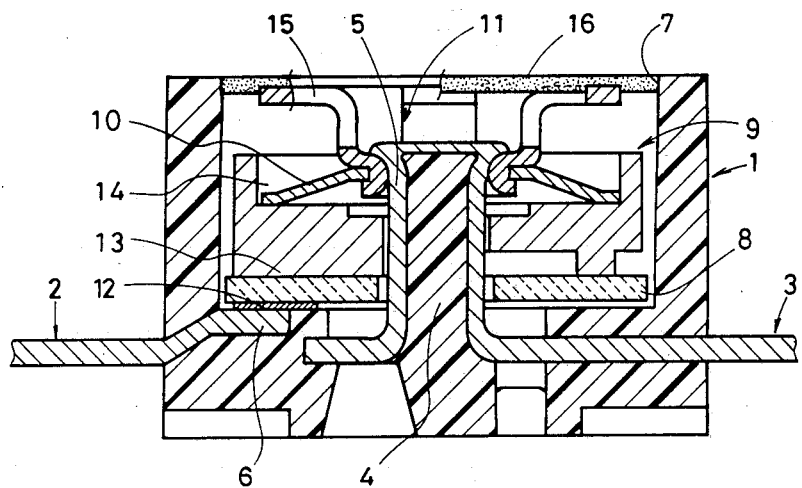
FIG. 2 is a cross-sectional view taken along the line II—II in FIG. 1.

FIG. 1 shows a trimmer capacitor which is a rotary electric device to which the present invention is applied, and FIG. 2 is a cross-sectional view taken along the line II—II in FIG. 1.

A case 1 is formed with two terminals 2 and 3 embedded therein. The case 1 is made of material which can withstand melted solder, such as heat-resistant thermosetting resin which is resistant to a temperature of about 300° C. An end of the terminal 3 located in the case 1 is shaped to receive a center shaft 4 within the case 1, for forming a cylindrical portion 5 defining a cylindrical outer peripheral surface around the center shaft 4. The center shaft 4 is formed by filling up the cylindrical portion 5 with resin when the terminal 3 including the cylindrical portion 5 is integrally molded with the case 1. An end 6 of the terminal 2 located in the case 1 is so located and formed as to be partially exposed at the bottom surface of the case 1. The terminals 2 and 3 extend outwardly from the case 1.

The case 1 has an opening 7 a rotary mechanism portion within the same under the opening 7. The rotary electric device as shown in FIGS. 1 and 2 is a trimmer capacitor, and hence the rotary mechanism portion is formed by a dielectric member 8 serving as a stator and a metal rotor 9, a spring 10 and a driver plate 11 forming parts of a rotor respectively, successively from the bottom in FIG. 2. The dielectric plate 8 is stationarily positioned in the case 1 and is provided in its lower surface with a substantially semicircular electrode conductor 12 which is in contact with the terminal 2. The metal rotor 9 has a rotor electrode 13 which is opposed to the electrode conductor 12 through the dielectric plate 8 such that the area of opposition to the electrode conductor 12 is changed by rotation of the metal rotor 9. The metal rotor 9 is provided in its upper surface with a groove 14 for receiving the spring 10, to thereby prevent rotation of the same with respect to the metal rotor 9. The driver plate 11 is caulked at its lower end to be mechanically fixed to the spring 10. The driver plate 11 is provided with an adjusting groove 15 which is generally in the form of a cross as clearly shown in FIG. 1.

In the aforementioned structure, when, for example, the forward end of a screwdriver is engaged in the adjusting groove 15 of the driver plate 11 to rotate the same, the metal rotor 9 is rotated via the spring 10. Therefore, the area of opposition of the electrode conductor 12 and the rotor electrode 13 is changed to enable adjustment of the capacity. The capacitor which is formed within is contacted by terminal 2 which is in provided with terminals with the electrode conductor 12 and by the terminal 3 which is connected with the driver plate 11 through the spring 10 which is in contact with the metal rotor 9.

The trimmer capacitor thus constructed is provided with a cover sheet 16 bonded to the inner peripheral surface of the edge portion of the opening 7 defined in the case 1 as shown in FIG. 2. The cover sheet 16 is illustrated as transparent in FIG. 1 to permit viewing of the interior of the case 1. The cover sheet 16 may be practically transparent, so that positions of rotation of the driver plate 11 and the metal rotor 9 can easily be discerned from the exterior of the case 1.

The cover sheet 16 is preferably formed by a thermosetting silicone adhesive which can withstand molten solder (e.g., resistant to immersion in a molten solder tank at a temperature of 270° C. for 20 seconds), and has proper elasticity and excellent adhesive strength, after hardening. Such thermosetting resin is employed for efficiently advancing the steps of forming the cover sheet as hereinafter described. Within the group of thermosetting resins, further, the hardening process of a hot setting adhesive can be more readily time-controlled in comparison with that of a room temperature setting adhesive, whereby the time loss is reduced.

A description will now be presented of an embodiment of a method of forming the cover sheet 16 with reference to FIGS. 3 to 6.

FIG. 3 shows a step of forming a film. A film 17 is spread in thickness thickness on a base plate 18 whose flatness is lower than 0.05 through a double-fluid thermosetting silicone adhesive, for example. The base plate 18 may or may not be provided in the form of a flexible sheet. The same applies to base plates 18 as hereinafter described. The film 17 must hold its form so that its thickness etc. is not changed before hardening, and hence it is made of material having high viscosity of, e.g., about 10,000 to 400,000 cps. The thickness of the film 17 is selected to be about 0.05 to 0.5 mm although the value can be changed as desired. Such thickness is related to extension strength and breaking strength of the cover sheet 16 as hereinafter described, and is appropriately adjusted to obtain desired extension strength and breaking strength. The base plate 18 is formed to resist adhering to the film 17 at least in its surface which is in contact with the film 17. For example, the base plate 18 itself is made of or coated with Teflon (trade name).

Then, a pressing step is performed as shown in FIG. 4. A rotary electric device 19 such as a trimmer capacitor is placed on the film 17 with the opening 7 of the case 1 facing the film 17. It is to be noted that the rotary electric device 19 as shown in FIGS. 4 to 7 is the trimmer capacitor illustrated in FIGS. 1 and 2 in a partially fragmented state is a part of the driver plate 11. However, it is to be noted that these drawings are modified to some extent in size to facilitate understanding of the respective steps.

Shown in the upper portion of the case 1 are the terminals 2 and 3, which are bent downwardly from their position shown in FIG. 2 along the case 1 to form a chip. As shown in FIG. 4, the film 17 is still in an unhardened state. Therefore, when pressure 20 is applied from the bottom side of the case 1, the edge portion of the opening 7 intrudes into the film 17, which in turn is partially brought into contact with the inner peripheral surface of the edge portion of the opening 7. Thus, the resin material enters the opening 7 to form the cover sheet for closing the opening 7. In the present embodiment, the pressure 20 is applied to such an extent that the edge portion of the opening 7 is brought into contact with the base plate 18 to sever the film 17. Within the case 1, the driver plate 11 is partially in contact with or embedded in the film 17. To this end, the upper surface of the driver plate 11 is preferably positioned to be lower than that of the case 1 by about 0.05 to 0.1 mm.

When the step as shown in FIG. 4 is performed, the base plate 18 is simultaneously heated as indicated by arrows 21. The heating level depends on the material forming the film 17, and in case of, e.g., a silicone adhesive, the base plate 18 is heated at a temperature of 130° to 150° C. When the state as shown in FIG. 4 is maintained under such heating condition, the resin forming the film 17 begins to harden. The base plate 18 is heated until the resin forming the film 17 is half-hardened, i.e., the heating operation is stopped in a state at which the resin has not attained its full adhesive strength and thereafter the base plate 18 is temporarily cooled. For example, such a half-hardened state of the resin is obtained by heating at a temperature of 130° C. for four minutes when the film 17 is formed by a hot setting silicone adhesive.

Then a separation step is performed as shown in FIG. 5 by separating the rotary electric device 19 from the base plate 18. Consequently, a portion of the film 17 for forming the cover sheet is separated from the base plate 18 with the case 1. The other portion of the film 17 which is in contact with the outer peripheral surface of the case 1 is readily separated from the case 1 since its adhesive strength is not yet sufficient, and hence only the aforementioned portion of the film 17 is now in contact with the rotary electric device 17. Thus, with this step, the sheet is separated from the base and the unnecessary portion of the film 17 in the outer peripheral portion of the edge of the opening 7 is also removed.

Then a subsequent step is performed as shown in FIG. 6 for hardening the film 17 introduced into the opening 7 of the case 1. In this step, the film 17 is heated until it is completely hardened, whereby the cover sheet 16 is bonded to the inner peripheral surface of the edge portion of the opening 7 in the case 1. Thus, a closed rotary electric device 19 is obtained.

In the aforementioned embodiment, silicone adhesive is employed as the material for the cover sheet 16. Therefore, the cover sheet 16 itself has elasticity for allowing insertion of a screwdriver etc. into the driver plate 11 with, e.g., a load smaller than 50 gf. The thickness of the cover sheet 16 is about 0.05 to 0.5 mm, and when the driver plate 11 is rotated by the screwdriver, the cover sheet 16 is readily broken between the inner peripheral surface of the case 1 and the outer peripheral surface of the driver plate 11 as indicated at 22 in FIG. 7 without requiring high torque. For example, the cover sheet 16 can be broken with torque lower than 150 g.cm. Further, even if the break line is formed in the position as shown by numeral 22, no wide clearance is defined since most of the cover sheet 16 is retained by the driver plate 11, whereby the rotary electric device 19 is protected from dust after adjustment.

Although the cover sheet 16 is broken by adjustment in the above description, it may be merely stretched or partially broken. The change in the cover sheet 16 by the adjusting operation depends on factors such as the material for the cover sheet 16 and the thickness thereof.

The process of performing the film forming step as shown in FIG. 3 is as follows.

Figure 8:
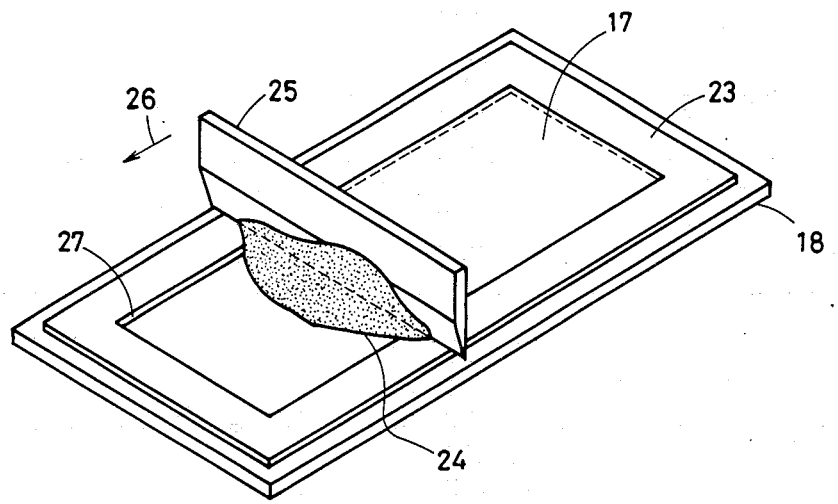
FIG. 8 is an illustration showing an example of a film forming step according to an embodiment of the present invention.

As shown in FIG. 8, on the base plate 18 is a frame plate 23 which is identical in thickness to the film to be obtained. A block 24 of unhardened resin is placed on one side of a squeegee 25, which in turn is moved in the direction indicated by an arrow 26 thereby to form a film 17 having even thickness in a window 27 of the frame plate 23. The squeegee 25 is made of, e.g., a metal or rubber having hardness higher than 80.

Figure 9:
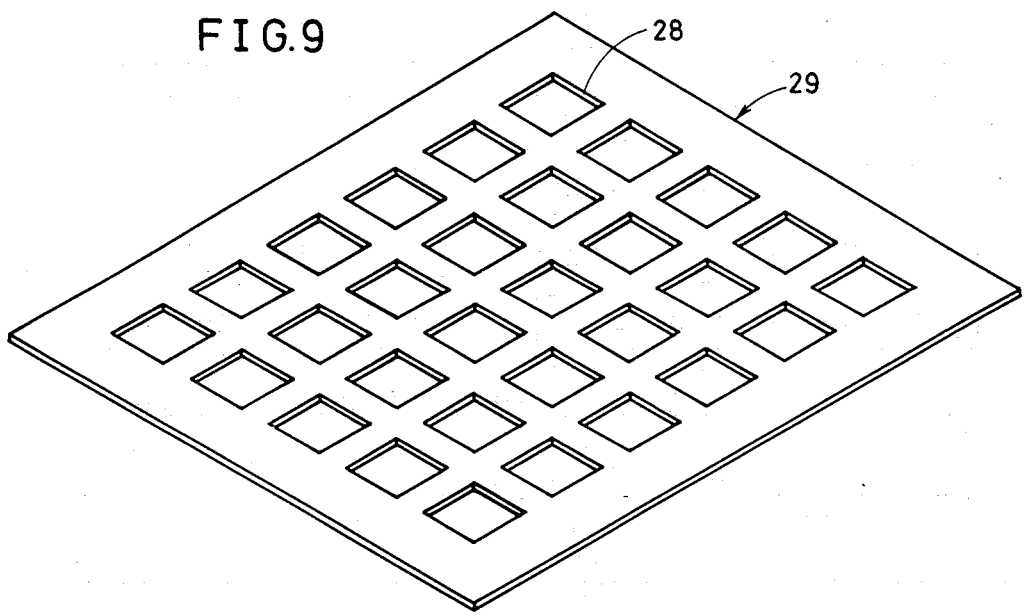
FIG. 9 is a perspective view showing a frame plate 29 employed as a substitute for a frame plate 23, as shown in FIG. 8.

The film 17 prepared by the step as shown in FIG. 8 is adapted to form a plurality of cover sheets 16. On the other hand, the film may be formed by employing a frame plate 29 as shown in FIG. 9 which is provided with a plurality of windows 28. In this case, each of the films formed in the respective windows 28 is adapted to form a cover sheet for one rotary electric device.

Figure 10:
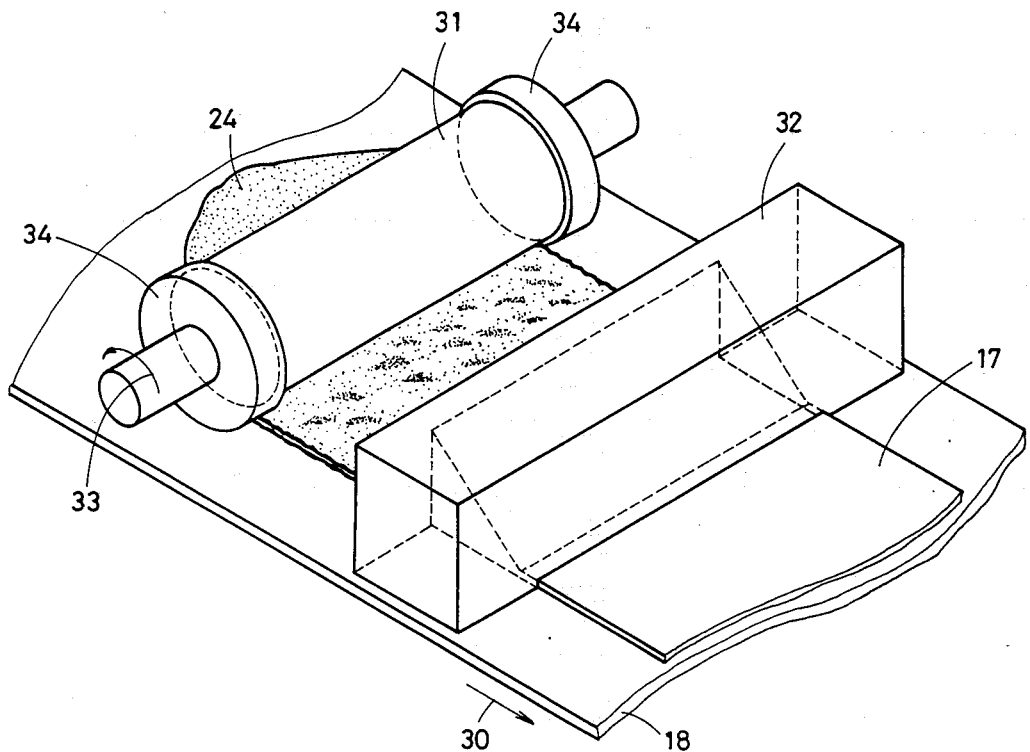
FIG. 10 is a perspective view showing an alternate process step for forming the film.
Figure 11:
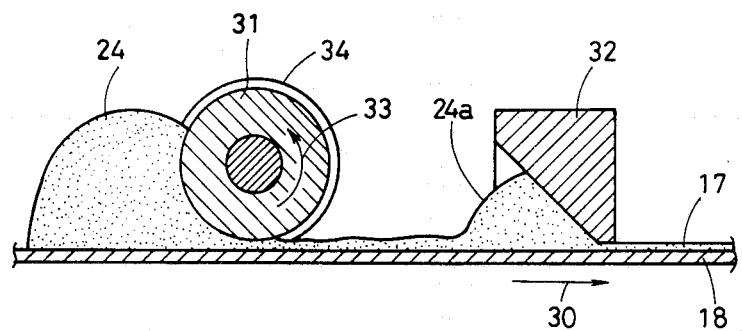
FIG. 11 is a cross-sectional view showing the film material in the embodiment of FIG. 10.

FIGS. 10 and 11 show another example of the film forming step, in which a base plate 18 is continuously carried in the direction as shown by an arrow 30. The base plate 18 is provided thereon with a roller 31 arranged at one longitudinal side and a blade 32 arranged at an opposite side. The roller 31 is rotated in the direction as indicated by an arrow 33, and the outer peripheral surface thereof defines a certain clearance with respect to the base plate 18. The roller 31 is provided on both sides with end guide members 34, which are driven independently of the roller 31, to be rotated in contact with the base plate 18 in response to the movement thereof. The end guide members 34 may instead be rectangularly formed instead, to be elastically pressed against the base plate 18 and are not rotated. The blade 32 is in contact with the base plate 18 at both end portions thereof, while defining a given clearance between the same and the base plate 18 at its central portion.

The unhardened resin block 24 is positioned at the upper side of the roller 31. The resin block 24 is pressed by the roller 31 against the base plate 18, and is thus securely attached to the base plate 18. Spreading of the resin block 24 is restricted by the end guide members 34 when the same passes through the roller 31, whereby the width of the resin block 24 is substantially controlled during passage through the roller 31. Although the initially formed resin film has a substantially even thickness after passage through the roller 31, the thickness is slightly greater than desired. A film 17 having the desired uniform thickness is obtained by passing the blade 32 over the initially formed film.

During performance of the aforementioned step, the speed of rotation of the base plate 18 in the direction 30 and the speed of rotation of the roller 31 in the direction 33 may be controlled based on the quantity of resin material 24a collected on the immediate upstream side of the blade 32 (see FIG. 11). For example, when the quantity of the resin material 24a is excessive, the speed of the roller 31 may be loosened or it may be stopped so that a substantially constant quantity of resin material 24a is continuously collected in front of the blade 32.

Figure 12:
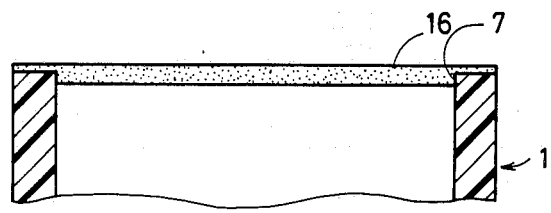
FIG. 12 is a cross-sectional view showing another embodiment of a cover sheet 16.

In the aforementioned embodiment as shown in FIGS. 2, 3 and 6, the cover sheet 16 is located within and does not project from the end surface of the case 1. However, as shown in FIG. 12, the cover sheet 16 may be extended over the upper end surface of the edge of an opening 7 defined in a case 1 while being also in contact with the inner peripheral surface of the edge of the opening 7. Such a cover sheet 16 is formed by changing, e.g., the pressure 20 with which the device is pressed against the film as described above with reference to FIG. 4. According to this embodiment, the area of contact between the cover sheet 16 and the case 1 is increased, whereby the adhesive strength is increased to further improve the sealing integrity of the rotary electric device.

Figure 15:
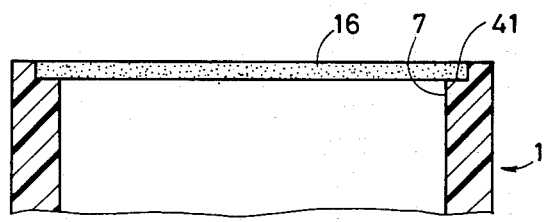
FIGS. 15 and 16 are cross-sectional views showing other embodiments of the cover sheet.
Figure 13:
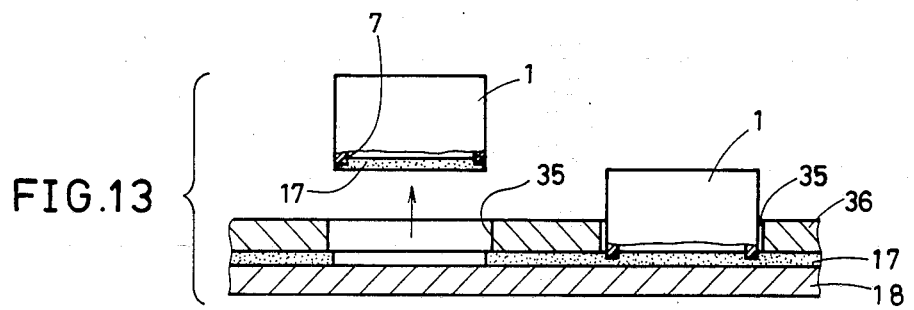
FIG. 13 is a cross-sectional view showing a preferred embodiment of a separation step according to the present invention.
Figure 14:
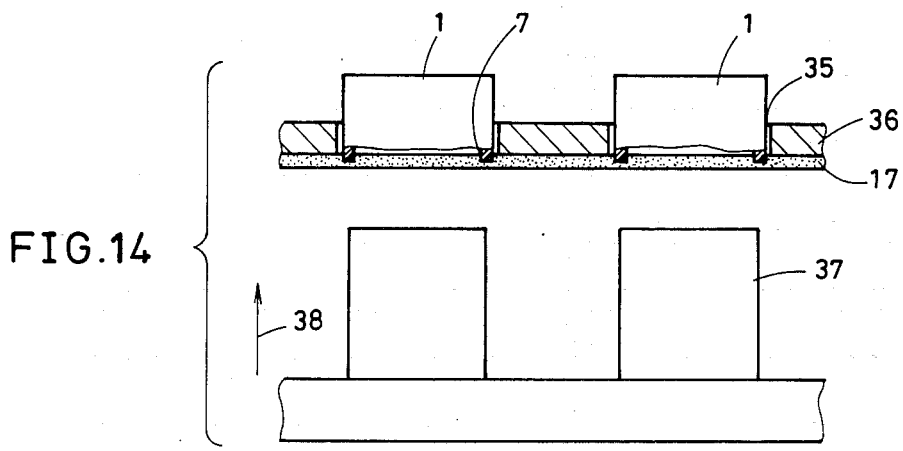
FIG. 14 is a partially fragmented front elevational view showing an example of a removing step according to the present invention.

When the cover sheet 16 is to be formed as shown in FIG. 12, the separation step or removing step shown in FIG. 5 may not be smooth. FIGS. 13 to 15 show methods of effectively solving such problems respectively.

Employed in FIG. 13 is a pressure plate 36 which is provided with a hole 35 for receiving the case 1 of a rotary electric device. The pressure plate 36 is placed on a film 17 while receiving the case 1 in the hole 35. When the case 1 is lifted from the hole 35 the pressure plate 36 restrains the film and only a portion of the film 17 adapted to close an opening 7 of the case 1 is separated from a base plate 18 with the case 1. The other portion of the film 17 positioned in the exterior of the outer periphery of the case 1 remains on the base plate 18 by the pressure applied from the pressure plate 36. Effectively, the separation step and a removing step corresponding to the aforementioned steps as shown in FIG. 5 are carried out simultaneously.

Employed in FIG. 14 are a pressure plate 36 and a punch 37. In this embodiment, a film 17 is entirely separated from a base plate 18 when a separation step is performed. The film 17 is retained by the case 1 as one unit including a portion within the inner periphery of the edge portion of an opening 7 as well as the other portion in the exterior of the outer periphery thereof. The pressure plate 36 similar to that shown in FIG. 13 is placed on the film 17. A hole 35 defined in the pressure plate 36 receives the case 1, and the pressure plate 36 is preferably in contact with the film 17 in this state. The punch 37 is arranged below the film and is formed to engage the edge portion of the opening 7. When the punch 37 is moved in the direction indicated by an arrow 38 to act on a portion of the film 17 for forming a cover sheet, the case 1 is severed from the hole 35 of the pressure plate 36 while the film 17 is simultaneously severed along the outer peripheral portion of the case 1.

Thus, FIG. 14 shows an embodiment of the removing step which is performed independently of the separation step.

In each of the aforementioned embodiments, the separation step and the removing step are performed while the resin material for the cover sheet is half-hardened. However, the separation step and the removing step may be, optionally, performed after the resin material is completely hardened.

Moreover, the base plate 18 may be made of material with a lower adherability to the film forming resin 17 or it may be surface processed to lower its adhesive property, whereby the film 17 can be readily separated from the base plate 18 after hardening. The degree of adhesion of the base plate 18 to the film 17 depends on the type of film resin material, and hence the material for the base plate 18 or the method of processing the surface thereof may be selected in consideration of the resin material to be employed. For example, the base plate 18 may be made of fluororesin or coated by the same so that its adhesive property is lowered with respect to most resins. Further, the base plate 18 may be coated by a mold releasing agent which is generally employed in plastic forming so that its adhesive property is lowered.

When hot setting resin is employed as the film material, the base plate 18 must be formed by material which can withstand the temperatures used for half-hardening or completely hardening the hot setting resin. Therefore, the base plate 18 is preferably formed by an aluminum plate coated by fluororesin or a sheet of heat-resistant resin. For the heat-resistant resin, polyester, polypropylene, polyethersulfone and T.P.X. polymer etc. can be used.

The cover sheet 16 may be made of room temperature setting resin, so that the base plate 18 need not necessarily be heat-resistant. When the room temperature setting resin is utilized as the material for the cover sheet 16, is a single-fluid silicon adhesive is preferably used.

When the separation or removing step is performed after complete hardening of the film 17 for forming the cover sheet 16, the processes as shown in FIGS. 13 and 14 are especially useful. If adhesion between the outer peripheral surface of the case 1 and the film 17 causes any problem in this case, a mold releasing agent may first be applied to the case 1 in portions which prevent adhesion to the film 17.

Figure 16:
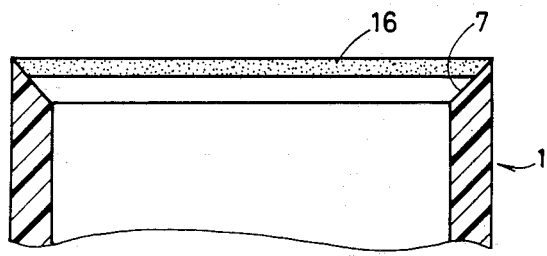

FIGS. 15 and 16 show modifications in relation to cover sheets 16 and openings 7 of cases of rotary electric devices respectively.

In FIG. 15, a stepped portion 41 is formed along the edge of the opening 7 in the case 1, so that the cover sheet 16 is retained on the stepped portion 41.

In FIG. 16, the inner peripheral surface of the edge of the opening 7 in the case 1 is defined by an inclined surface. Therefore, the cover sheet 16 is formed to bond to the inner peripheral surface of the edge of the opening 7 having the inclined surface. In this embodiment, a knife edge is thus formed around the opening 7 of the case 1, and hence the film 17 can be severed without requiring excessive pressure 20 in the aforementioned step as shown in FIG. 4.

Figure 17:
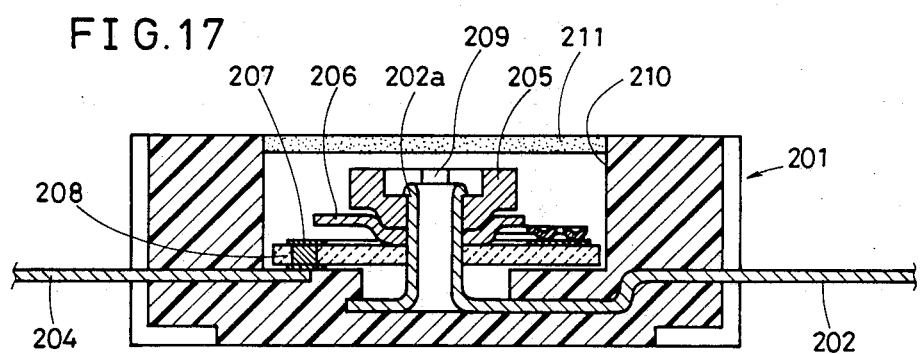
FIG. 17 is a longitudinal sectional view showing a variable resistor employed as another example of a rotary electric device to which the present invention can be applied.

FIG. 17 shows a variable resistor, illustrating another rotary electric device, to which the present invention is applied.

A heat-resistant resin case 1, is formed with terminals 202 and 204 embedded therein. The end of the terminal 202 located in the case 201 is formed as a throttle grommet 202a, which produces an axis of rotation for a rotor 205 and a slider 206. An end of the other terminal 204 located in the case 201 is partially exposed on the bottom surface of the case 201. A stator 208 having a resistance film 207 connected with the terminal 204 is placed on the bottom of the case 201. The slider 206 and the rotor 205 are successively placed on the stator 208, and the upper end of the throttle grommet 202a is caulked thereby to retain the said components.

A screwdriver or similar device can engage an adjusting groove 209 defined in the upper surface of the rotor 205, to rotate the rotor 205 and to thereby change the resistance value.

In such a variable resistor, a cover sheet 211 is formed to close the opening 210 of the case 201. The cover sheet is bonded to the inner peripheral surface of the opening 210. The cover sheet 211 may be formed of the same material and methods as those described with reference to the aforementioned embodiments.

In the variable resistor as shown in FIG. 17, a clearance is defined between the cover sheet 211 and the rotor 205.

In this variable resistor, the terminals 202 and 204 may be severed to an appropriate length and downwardly bent along the case 201 to make a chip-like resistor component.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A method of forming a cover sheet over an opening defined in an electric device, said method comprising the steps of:
   forming a thin film of hardenable resin over a base plate, said resin being a thermosetting resin that is sufficiently rigid to maintain its form upon being removed from said plate before being fully hardened, and remains both elastic and heat-resistant after hardening;
   pressing said electric device against said film with said opening facing said film, said electric device being pressed with sufficient force to cause at least a portion of said film to intrude into said opening and to engage inner peripheral surfaces of said electrical device which define said opening and to adhere thereto;
   separating said electric device, and a portion of said film which faces and is substantially coextensive with said opening, from said base plate and from the portion of said film that is not substantially coextensive with said opening; and
   hardening said portion of film which has been removed from said plate, to form said cover sheet.

2. A method in accordance with claim 1, wherein said thermosetting resin is a silicone adhesive.

3. A method in accordance with claim 2, wherein said silicone adhesive is a hot setting type of resin.

4. A method in accordance with claim 2, wherein said silicone adhesive is a room temperature setting type resin.

5. A method in accordance with claim 1, wherein said separating step is carried out when said resin is in a half-hardened state.

6. A method in accordance with claim 1, further including the step of removing excess and an unnecessary portion of said film located over the exterior of an outer periphery of an edge of said opening.

7. A method in accordance with claim 6, wherein said removing step is performed simultaneously with said separating step.

8. A method in accordance with claim 1, wherein said force is sufficient to cause said edge of said opening to contact said base plate to thereby sever said film.

9. A method in accordance with claim 1, wherein said force is controlled to ensure that an edge defining said opening is not brought into contact with said base plate to thereby assure that said film is not severed.

10. A method in accordance with claim 1, further including the step of conditioning the surface of said base plate to prevent said film from adhering to said base plate to thereby facilitate said separating step.

11. A method in accordance with claim 1, wherein said electric device includes a stationary component and a rotatable component which is coupled to and rotatable with respect to said stationary component, said rotatable component being located adjacent said opening, said film being formed to be sufficiently thick to permit said cover sheet to contact and cover a portion of said rotatable component.

12. A method in accordance with claim 1, wherein said electric device is a trimmer capacitor.

13. A method in accordance with claim 1, wherein said electric device is a variable resistor.

14. A method in accordance with claim 1, wherein said opening is defined by a peripheral edge of said electric device, said peripheral edge having an inclined surface along the thickness dimension of a case which encloses said electric device, said cover film being bonded to said inclined surface.

15. The method in accordance with claim 1, wherein said opening is defined by a peripheral edge of the housing of said electric device, said peripheral edge being step-shaped and said cover sheet being positioned at and adhering to said peripheral edge of said edge.

16. A method of forming a cover sheet over an opening defined in an electric device, said method comprising the steps of:
   forming a thin film of hardenable resin over a base plate, said resin being a thermosetting resin that is sufficiently rigid to maintain its form upon being removed from said plate before being fully hardened, and remains both elastic and heat-resistant after hardening;

pressing said electric device against said film prior to any substantial heating of said film with said opening facing said film, said electric device being pressed with sufficient force to cause at least a portion of said film to intrude into said opening and to engage inner peripheral surfaces of said electrical device which define said opening and to adhere thereto;

separating said electric device, and a portion of said film which faces and is substantially coextensive with said opening, from said base plate and from the portion of said film that is not substantially coextensive with said opening; and hardening said portion of film which has been removed from said plate, to form said cover sheet.

* * * * *